United States Patent [19]

Goutti

[11] Patent Number: 5,729,177
[45] Date of Patent: Mar. 17, 1998

[54] COMMON MODE RAIL-TO-RAIL AMPLIFIER WITH A CONSTANT TRANSCONDUCTANCE

[75] Inventor: Frédéric Goutti, Grenoble, France

[73] Assignee: SGS-Thomson Microelectronics S.A., Saint Genis, France

[21] Appl. No.: 574,027

[22] Filed: Dec. 18, 1995

[30] Foreign Application Priority Data

Dec. 21, 1994 [FR] France ................. 94 15672

[51] Int. Cl.$^6$ ..................................... H03F 3/45
[52] U.S. Cl. ...................... 330/257; 330/258; 330/261; 330/311
[58] Field of Search ..................... 330/252, 257, 330/258, 261, 311

[56] References Cited

U.S. PATENT DOCUMENTS

| | | | |
|---|---|---|---|
| 4,532,479 | 7/1985 | Blauschild | 330/261 |
| 4,649,352 | 3/1987 | Blauschild | 330/261 |
| 4,918,398 | 4/1990 | Huijsing et al. | 330/252 |
| 5,153,529 | 10/1992 | Koda et al. | 330/261 |
| 5,311,145 | 5/1994 | Huijsing et al. | 330/261 X |

OTHER PUBLICATIONS

French Search Report from French Patent Application 94 15672, filed Dec. 21, 1994.
IEEE Journal Of Solid State Circuits, vol. 24, No. 6, Dec. 1989, pp. 1551–1559, Fonderie, et al., "1–V Operational Amplifier With Rail To Rail Input and Output Ranges".

*Primary Examiner*—James B. Mullins
*Attorney, Agent, or Firm*—Wolf, Greenfield & Sacks, PC; James H. Morris

[57] ABSTRACT

An amplifier includes two complementary differential input stages and a first current source that is switched as a function of the input voltage of the amplifier in order to render active one or the other of the input stages by establishing the quiescent current of the input stage. A folded cascode stage has two cascode transistors whose currents are determined by a bias voltage of these transistors and reduced by the currents circulating in the output branches of a first of the differential input stages. Circuitry switched at the same time as the first current source for maintaining a constant current in the cascode transistors when one of the differential stages changes between an active state and an inactive state.

6 Claims, 2 Drawing Sheets

COMMON MODE RAIL-TO-RAIL AMPLIFIER WITH A CONSTANT TRANSCONDUCTANCE

BACKGROUND OF THE INVENTION

1. Field of the Invention

The present invention concerns a common mode rail-to-rail amplifier, that is to say an amplifier whose inputs may support voltages that are practically equal to the supply voltages of the amplifier, and whose transconductance is constant across the input voltage range. The present invention is more particularly directed to such an amplifier that has an intermediate folded cascode stage.

2. Discussion of the Related Art

FIG. 1 represents an example of an amplifier that has all these features, such as described in IEEE Journal of Solid-State Circuits, Vol. 24, No. 6, December 1989, "1-V Operational Amplifier with Rail-to-Rail Input and Output Ranges". It comprises two complementary differential input stages. The first differential stage comprises two NPN transistors Q1 and Q2 whose emitters are connected to a low supply voltage GND via an NPN transistor Q3 that forms the output transistor of a current mirror. The second differential stage comprises two PNP transistors Q4 and Q5 whose emitters are connected to a high supply voltage Vcc via a current source 10 that supplies a constant current 2I1. The base terminals of transistors Q1 and Q4 constitute a first input D1 of the amplifier, and the base terminals of transistors Q2 and Q5 constitute a second input D2 of the amplifier.

The current source 10 is also connected to the supply voltage GND via a PNP transistor Q6 that acts as a switch and an NPN transistor Q7 that forms the input transistor of the current mirror that has transistor Q3 as its output transistor. The emitters of transistors Q3 and Q7 are connected to the supply voltage GND whilst their base terminals are connected to the collector of transistor Q7. Transistor Q6 has its emitter connected to the current source 10, its collector connected to the collector of transistor Q7, and its base connected to a constant switching voltage Vs.

The amplifier of FIG. 1 has two principal operating ranges. In the first range, for which the current values have been represented in FIG. 1, the common mode input voltage of the amplifier (the average of the voltages on the inputs D1 and D2) is greater than the voltage Vs. Transistor Q6 is therefore on and conducts all of the current 2I1 from the current source 10 towards transistor Q7. This current 2I1 is mirrored by transistor Q3 in the differential stage Q1, Q2 and establishes the quiescent current for each output branch of this stage (the collectors of transistors Q1 and Q2) at a value of I1. The stage Q1, Q2 is active. In this first range, the stage Q4, Q5 receives no current from the source 10; it is inactive.

In the second range, the common mode input voltage is less than the voltage Vs. Transistor Q6 is therefore off and all of the current of the source 10 is supplied to the stage Q4, Q5 whose output branches each conduct a current of value I1. In this second range, the stage Q1, Q2 receives no current. The stage Q4, Q5 is active and the stage Q1, Q2 is inactive.

With this configuration, only one stage at a time is active, whatever the common mode input voltage. This ensures that the transconductance of the amplifier is always equal to that of one stage, that is to say it is constant.

In practice, the two stages are partially active in a transient range where the input common mode voltage is proximate to voltage Vs. The constant value of the transconductance is not affected by this transient range.

The amplifier of FIG. 1 comprises a folded cascode intermediate differential stage. One can attempt to use such a stage because it presents the advantage of improving the speed and the stability of the amplifier with respect to other types of output stages. This folded cascode stage comprises two cascode PNP transistors Q8 and Q9 whose base terminals are biased by the same reference voltage Vb. The emitters of transistors Q8 and Q9 are respectively connected to the supply voltage Vcc by the respective resistors 12 and 13 that have the same value of resistance, and to the respective collectors of transistors Q1 and Q2 (output terminals of the stage Q1, Q2). The collectors of transistors Q8 and Q9 are respectively connected to the collectors of the two NPN transistors Q10 and Q11. Transistors Q10 and Q11 are respectively the input and output transistors of a current mirror. The base terminals of transistors Q10 and Q11 are connected to the collector of transistor Q10 and the respective emitters of these transistors are connected to the supply voltage GND by the respective resistors 15 and 16 that have the same value of resistance. The output of the amplifier is taken from the collectors of transistors Q9 and Q11. The emitters of transistors Q10 and Q11 are also respectively connected to the respective collectors of transistors Q4 and Q5 (output terminals of the differential stage Q4, Q5).

The use of a folded cascode output stage in an amplifier that has two differential input stages that operate in an either/or mode, of the type illustrated in FIG. 1, presents the inconvenience of deteriorating the common mode rejection (CMR) characteristic of the amplifier. As with all imperfect amplifiers, the output signal of the amplifier of FIG. 1 varies as a function of the common mode input voltage. This variation remains relatively low in each of the two operating rages of the amplifier. However, during the switching from one mode to the other, the output signal shifts and this is the origin of the degradation of common mode rejection.

SUMMARY OF THE INVENTION

An object of the present invention is to provide an amplifier of the type of FIG. 1 equipped with a compensation circuit that cancels the shift in the output signal when the amplifier switches from one operating range to the other.

To achieve this and other objects, the invention provides an amplifier comprising two complementary differential input stages and a first current source that is switched as a function of the input voltage of the amplifier in order to render active one or the other of the input stages by establishing the quiescent current of the input stage. A folded cascode stage has two cascode transistors whose currents are determined by a bias voltage of these transistors and reduced by the currents circulating in the output branches of a first of the differential input stages. A compensation circuit switched at the same time as the first current source for maintaining a constant current in the cascode transistors when one of the differential stages changes between an active state and an inactive state.

According to an embodiment of the invention, the compensation circuit ensures a constant current in the cascode transistors by modifying the bias voltage of these cascode transistors.

According to an embodiment of the invention, the cascode transistors are connected to a supply voltage (Vcc) via first respective resistors of same value and form the output transistors of a first current mirror. The output branches of the first differential stage are connected between the cascode transistors and the first resistors. An input transistor of the first current mirror is connected to the supply voltage by a second resistor that has the same value as the first resistors, and receives a constant current. A second switched current source injects, between the second resistor and the input transistor of the first current mirror and when the first differential stage is active, a current equal to the quiescent current of each output branch of the first differential stage.

According to an embodiment of the invention, the second current source is a first output of a second current mirror having a second output that establishes the quiescent current of the first differential input stage and an input connected to the first current source by a transistor that is switched as a function of the input voltage of the amplifier, the first current source also being connected to the second differential input stage for establishing the quiescent current of this second differential input stage.

BRIEF DESCRIPTION OF DRAWINGS

These objects, features and advantages, amongst others of the present invention will be described in more detail in the following description of particular non-limiting embodiments, by referring to the attached drawings among which.

DESCRIPTION OF PREFERRED EMBODIMENTS

Figure 1:
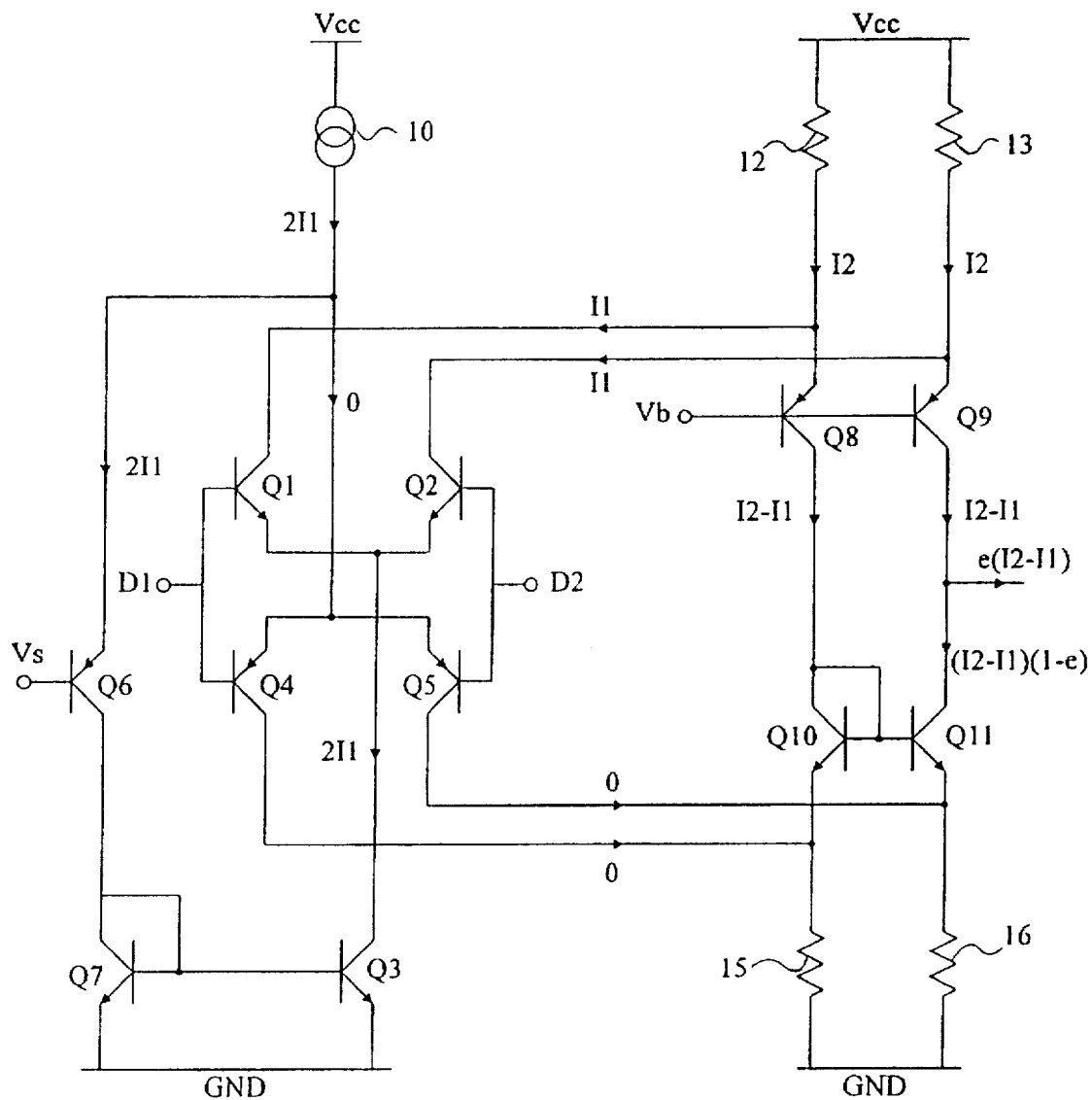
FIG. 1 represents an example of an amplifier with constant transconductance over a large common mode range, having a folded cascode output stage.

The present invention is based on the analysis following the functionality of the amplifier of FIG. 1. The voltage at the emitters of transistors Q8 and Q9 is fixed at a constant value by the bias voltage Vb. Therefore, the current flowing through each of the resistors 12 and 13 is at a constant value I2 which is chosen to have a greater value than the value of quiescent current I1 in each of the branches of the differential stage Q1, Q2.

When the differential stage Q1, Q2 is active, its branches each take a quiescent current I1 from the emitters of transistors Q8 and Q9. Therefore the currents in transistors Q8 and Q9 are established at value I2–I1. The stage Q4, Q5 being inactive, its output branches take no current from the emitters of transistors Q10 and Q11. Transistors Q10 and Q11 are connected as a current mirror and the current in transistor Q10 is mirrored in the collector of transistor Q11. However, this mirroring is not perfect because the current I2–I1 arriving to transistor Q10 is mirrored with a proportionality coefficient 1-e that is smaller than 1, whatever the quality of current mirror used. As a consequence, the output current of the amplifier presents an offset of e(I2–I1) with respect to the required value.

When the stage Q4, Q5 is active, its branches each take a current I1 from the emitters or transistors Q10 and Q11. The output branches of the differential stage Q1, Q2 do not extract more current from the emitters of transistors Q8 and Q9 which each conduct a current I2. This current I2 arrives at the collector of transistor Q10 and is mirrored at the collector of transistor Q11 with a coefficient of proportionality 1-e as mentioned above. The output of the amplifier therefore supplies an offset current of value eI2 in place of e(I2–I1).

As a consequence, when passing from one operating range to the other, the offset current at the output of the amplifier shifts to a value eI1 that is far from negligible and that degrades considerably the common mode rejection of the amplifier.

This shift, as illustrated in the above analysis, is due to the fact that the current of transistors Q8 and Q9 changes from a value of I2–I1 to a value of I2 when the amplifier changes from one operating range to the other. In order to avoid a shift in current at the output, the present invention maintains the current of transistors Q8 and Q9 constant during both operating ranges of the amplifier.

Figure 2:
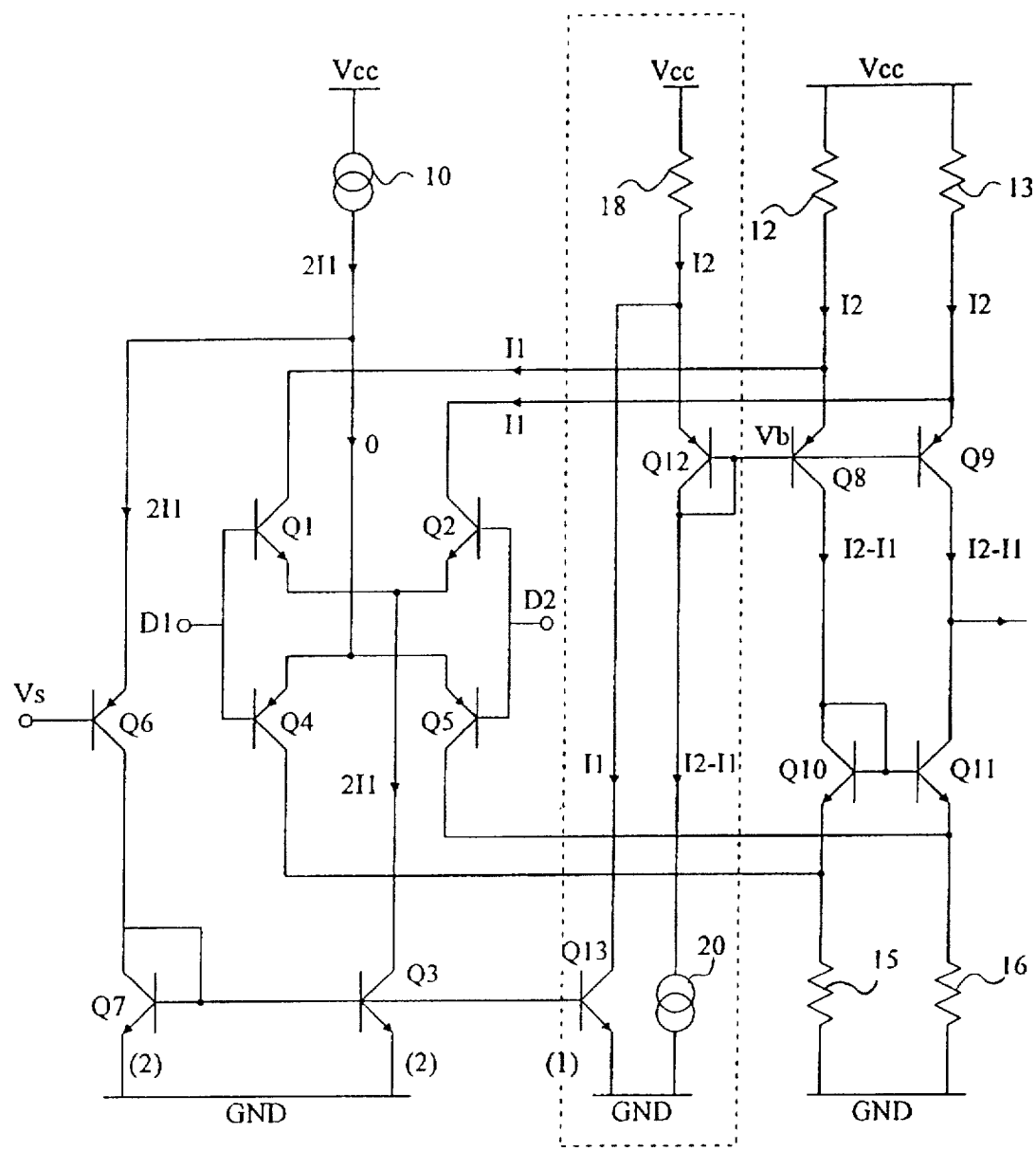
FIG. 2 represents an amplifier of the type of FIG. 1 having a circuit according to the invention for improving the common mode rejection of the amplifier.

FIG. 2 represents the amplifier of FIG. 1 that has a circuit according to the invention that allows one to obtain this constant current in transistors Q8 and Q9. This circuit is represented within the block having dashed lines.

Transistors Q8 and Q9, rather than being biased by a constant voltage Vp, constitute two output transistors of a current mirror whose input transistor is a PNP transistor Q12. Transistor Q12 has its base connected to its collector and to the base terminals of transistors Q8 and Q9 the emitter of transistor Q12 is connected to the supply voltage Vcc by a resistance 18 that has the same value of resistance as resistors 12 and 13. The collector of Q12 is connected to the supply voltage GND via a current source 20 that has a constant current of I2–I1. An NPN transistor Q13 constitutes a second output transistor of the current mirror Q3, Q7 and its base and emitter terminals are respectively connected to those of transistor Q3. The collector of transistor Q13 is connected to the emitter of transistor Q12. As indicated between brackets in FIG. 2, the size of transistors Q3 and Q7 are twice that of transistor Q13. Therefore, the collector current of transistor Q13 is half that of transistor Q3.

In the first operating range of the amplifier, for which the current values are indicated in FIG. 2, the totality of the current 2I1 of the source 10 is supplied to the differential stage Q1, Q2 by transistor Q3, and half of this current, I1, is taken from the emitter of transistor Q12 by transistor Q13. Thus a current I1 is taken by each of the emitters of transistors Q8, Q9 and Q12. Transistors Q8, Q9 and Q12 thus find themselves with the same operating conditions and they comprise a current mirror; the collector current I2–I1 of transistor Q12 is mirrored in the collectors of transistors Q8 and Q9.

In the second operating range, the totality of the current 2I1 of the source 10 is supplied to the differential stage Q4, Q5. No current is therefore taken from the emitters of transistors Q8, Q9 and Q12 by the branches of the differential stage Q1, Q2 and by transistors Q13. Transistors Q8, Q9 and Q12 are again at the same operating conditions and they comprise a current mirror. The collector current I2–I1 of transistor Q12 is still mirrored in the collectors of transistors Q8 and Q9.

The collector currents of transistors Q8 and Q9 do not vary from one operating rage to the other, which cancels the shift undergone by the output offset of the amplifier.

The present invention may be subject to numerous variations and modifications that are apparent to one skilled in the art. For example, if transistors Q10 and Q11 are cascode transistors that are biased by a constant voltage, and if transistors Q8 and Q9 form a current mirror, the shift at the output of the amplifier may be canceled by injecting into the resistors 15 and 16 a mirrored current of the collector current of transistor Q13.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. An amplifier comprising:

two complementary differential input stages;

a first switched current source that is switched as a function of an input voltage of the amplifier in order to render active one or the other of the differential input stages by establishing a quiescent current of the differential input stage;

a folded cascode stage having two cascode transistors whose currents are determined by a bias voltage of these transistors and reduced by currents circulating in output branches of a first of the differential input stages; and a compensation circuit switched at the same time as the first current source for maintaining a constant current in the cascode transistors when one of the differential input stages changes between an active state and an inactive state.

2. An amplifier according to claim 1, wherein the compensation circuit ensures a constant current in the cascode transistors by modifying a bias voltage of these cascode transistors.

3. An amplifier according to claim 2, wherein:

said cascode transistors are connected to a supply voltage via first respective resistors of same value, and forming output transistors of a first current mirror, the output branches of the first differential stage being connected between the cascode transistors and the first resistors; and further comprising an input transistor of the first current mirror, connected to said supply voltage by a second resistor that has the same value as the first resistors, said input transistor receiving a constant current; and a second switched current source for injecting, between the second resistor and the input transistor of the first current mirror, when the first differential stage is active, a current equal to the quiescent current of each output branch of the first differential stage.

4. An amplifier according to claim 3, wherein the second current source is a first output of a second current mirror having a second output that establishes the quiescent current of the first differential input stage and an input connected to the first current source by a transistor that is switched as a function of the input voltage of the amplifier, the first current source also being connected to the second differential input stage for establishing a quiescent current of the second differential input stage.

5. A method for biasing an amplifier, comprising steps of:

selectively establishing and disestablishing a quiescent current in an input stage;

providing to an output stage a bias current dependent on the quiescent current in the input stage;

maintaining the bias current constant during the step of selectively establishing and disestablishing.

6. An amplifier circuit, comprising:

an input stage with a quiescent current flowing therein, the quiescent current supplied through a load;

an output stage with a bias current flowing therein, the bias current supplied through the load;

means for switching on and off the quiescent current flowing in the input stage; and means for biasing the output stage so the bias current remains substantially constant while operation of the means for switching on and off the quiescent current flowing in the input stage changes a total current flowing through the load.

* * * * *